(12) United States Patent
Morita et al.

(10) Patent No.: US 8,008,772 B2
(45) Date of Patent: Aug. 30, 2011

(54) SEMICONDUCTOR DEVICE, MANUFACTURING METHOD THEREOF, COMPOSITE METAL BODY AND MANUFACTURING METHOD THEREOF

(75) Inventors: Toshiaki Morita, Hitachi (JP); Yusuke Yasuda, Hitachi (JP); Eiichi Ide, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 774 days.

(21) Appl. No.: 12/019,789

(22) Filed: Jan. 25, 2008

(65) Prior Publication Data

US 2008/0237851 A1  Oct. 2, 2008

(30) Foreign Application Priority Data

Mar. 28, 2007 (JP) ................. 2007-084265

(51) Int. Cl.
*H01L 23/48* (2006.01)

(52) U.S. Cl. ....................... 257/741; 257/737

(58) Field of Classification Search .................. 257/741, 257/737
See application file for complete search history.

(56) References Cited

U.S. PATENT DOCUMENTS

| 2006/0022326 A1 | 2/2006 | Morita et al. |
| 2006/0267218 A1 | 11/2006 | Hozoji et al. |
| 2007/0216012 A1 | 9/2007 | Hozoji et al. |

FOREIGN PATENT DOCUMENTS

JP  2004-107728  4/2004

*Primary Examiner* — Douglas M Menz
(74) *Attorney, Agent, or Firm* — Antonelli, Terry, Stout & Kraus, LLP.

(57) ABSTRACT

A semiconductor device having a structure in which a semiconductor element and a Cu or Ni electrode are connected by way of a bonding layer comprising Cu, and the Cu bonding layer and the Cu or Ni electrode are diffusion-bonded to each other. The bonding layer is formed by conducting bonding in a reducing atmosphere by using a bonding material containing particles of Cu oxide with an average particle size of 1 nm to 50 μm and a reducing agent comprising an organic material, thereby providing excellent bonding strength to Ni or Cu electrode.

17 Claims, 12 Drawing Sheets

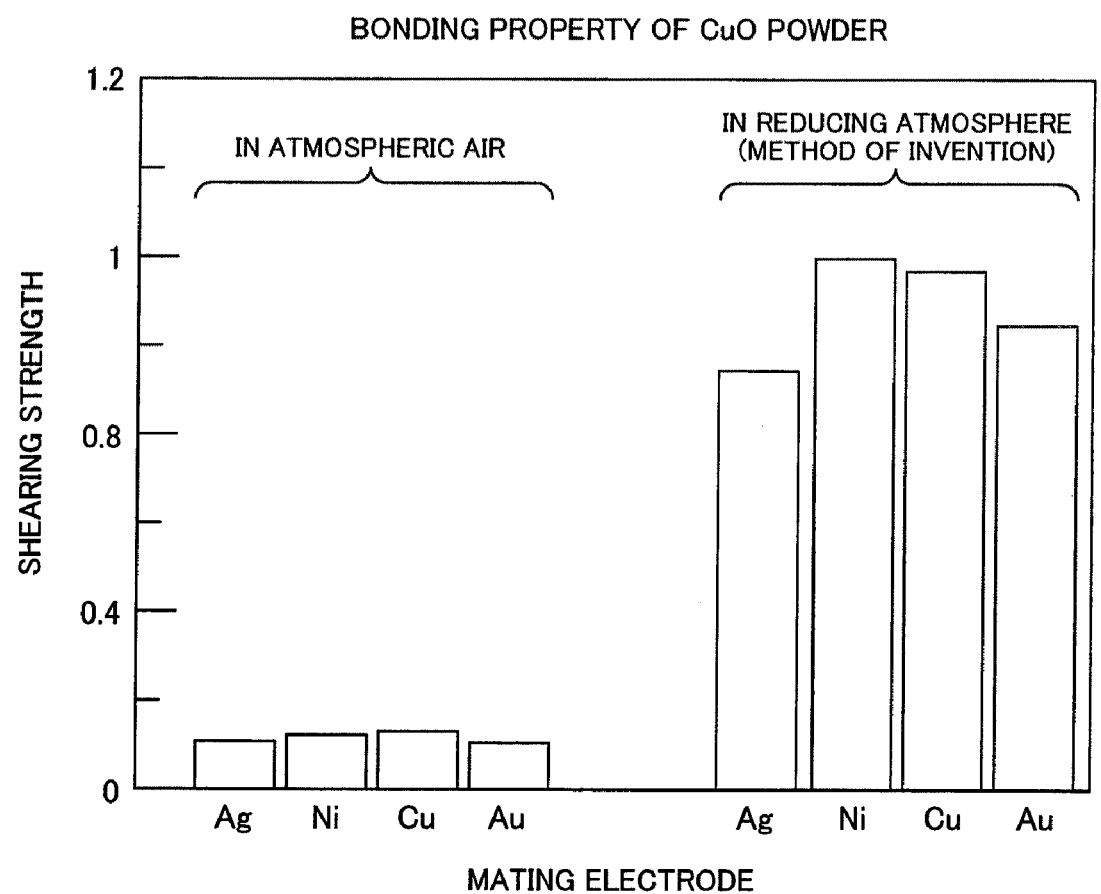

CROSS SECTION OF BONDED PORTION
BY CONVENTIONAL PROCESS

EXAMPLE FOR BONDING PROCESS FLOW

SEMICONDUCTOR DEVICE, MANUFACTURING METHOD THEREOF, COMPOSITE METAL BODY AND MANUFACTURING METHOD THEREOF

CLAIM OF PRIORITY

The present application claims priority from Japanese application serial No. 2007-84265, filed on Mar. 28, 2007, the content of which is hereby incorporated by reference into this application.

FIELD OF THE INVENTION

The present invention concerns a semiconductor device using a bonding material comprising metal particles with a particle size of 1 to 100 nm as a main agent for bonding, a manufacturing method thereof, a power conversion device using the semiconductor device and a hybrid car having the power conversion device mounted thereon, as well as it relates to a composite metal body formed by bonding using the bonding material and a manufacturing method thereof.

BACKGROUND OF THE INVENTION

It is known that when a particle size of a metal particle is decreased to a size of 100 nm or less and the number of constituent atoms decreases, the ratio of the surface area to the volume of the particle increases abruptly and the melting point or the sintering temperature is greatly lowered compared with a case in a state of bulk. It has been studied to use a metal particle with a particle size of 1 to 100 nm as a bonding material by utilizing the low temperature sintering function (refer, for example, to Japanese Unexamined Patent Application: JP-A No. 2004-107728).

JP-A No. 2004-107728 discloses to conduct bonding by using a bonding material comprising metal particles with an average particle size of 100 nm or less in which a film of an organic material is formed to the periphery of core of the particle and decomposing the organic material by heating to sinter the metal particles to each other. In this bonding method, since the metal particles after bonding are bonded by metallic bonding at the bonding boundary, as well as they are converted into a bulk metal, they have extremely high heat resistance, reliability, and high heat dissipation property. Further, while lead-free solder has been demanded in the connection of electronic parts, etc, materials as a substitute for high temperature solders have not yet been available. In the mounting of electronic parts, since it is indispensable for using hierarchical solder, advent of a material in place of the high temperature solders has been desired. Accordingly, the bonding technique is also expected as a material capable of replacing the high temperature solder.

The present inventors have made a study on the bonding material using metal particles with a particle size of 100 nm or less as a main agent for bonding described in JP-A No. 2004-107728. As a result, it has been found that while the bonding material can provide satisfactory bonding strength to a mating electrode such as of Au, Ag, or Pd as a material to be bonded, no sufficient bonding strength can be obtained to Cu or Ni, which is applied frequently in the mounting of the semiconductors.

FIG. 9 shows the result for the evaluation of the bonding strength conducted for each of the electrode materials. Bonding to Au, Ag, Pd, Ni, and Cu electrodes were conducted at a constant bonding temperature of 250° C. and a pressure of 1.0 MPa using silver particles with an average particle size of 10 nm coated with an amine type organic material.

In FIG. 9, the ordinate shows a shearing strength, which is normalized with reference to the value of the Ag electrode. As a result, it has been found that while satisfactory bonding strength is obtained to Au, Ag, and Pd electrodes, no sufficient bonding strength can be obtained to Ni and Cu electrodes in the bonding in atmospheric air.

The organic material formed as the coating film for super-micro particles described in JP-A No. 2004-107728 is a material eliminated only by heating in atmospheric air and it is considered that while the material is effective for less oxidizing electrodes but it is not suitable to the bonding of easily oxidizable Cu, or Ni.

When the bonding surface by the method of JP-A No. 2004-107728 (using a bonding material comprising Cu as a metal core which is coated with an amine compound and heated in atmospheric air) is observed under a microscope, a nickel oxide layer is formed between a sintered pure copper layer and an Ni electrode as shown in FIG. 10 and it is considered that this lowers the bonding strength. Further, when the bonding boundary between the Cu electrode (underlayer) and the sintered pure copper layer using the bonding material is observed, a copper oxide layer is formed at the bonding boundary as shown in FIG. 11. It is considered that this lowers the bonding strength.

In a case of bonding an electronic part constituting a semiconductor device by using a bonding material comprising micro metal particles as a main agent for bonding, it is necessary to ensure electric conduction. Further, relaxation of thermal strain and heat conductivity are also required for the bonding material. Further, it is necessary that good bonding can be obtained also to Ni and Cu electrodes that are used most frequently used in the field of semiconductor devices.

The invention intends to improve the bonding reliability at a bonding portion between an electrode comprising a material selected from the group consisting of Ag, Au, Ni, Cu, or alloys thereof of a semiconductor devices and a bonding material using Cu particles as a main agent for bonding, and provides a semiconductor device utilizing the same, a manufacturing method thereof, a composite metal body and a manufacturing method thereof.

SUMMARY OF THE INVENTION

As a result of an earnest study made by the present inventors for solving the subject described above, it has been found that excellent bonding strength to a metal selected from the group consisting of Ag, Au, Ni, Cu and alloys thereof can be obtained by conducting bonding in a reducing atmosphere using a bonding material containing particles of cupric oxide (CuO) with an average particle size of 1 nm to 50 μm as a Cu particle precursor and a reducing agent comprising an organic material.

The invention provides a semiconductor device in which a semiconductor element and Ag, Au, Cu, or Ni constituting an electrode or a wiring layer or a cover layer formed on the surface thereof are connected by way of a bonding layer comprising a fired Cu layer, and having a structure where the bonding layer and the Cu or Ni electrode are diffusion-bonded to each other.

Further, the invention provides a method of manufacturing a semiconductor device formed by bonding an electrode of a semiconductor element and a wiring for taking out an electric signal of the semiconductor element to the outside in which at least one of the electrode of the semiconductor element or the wiring comprises Ag, Au, Cu, or Ni, or an alloy thereof, and which includes a step of bonding the electrode and the wiring by heating in a reducing atmosphere by a bonding material containing particles of cupric oxide with an average particle size of 1 nm to 50 nm and a reducing agent comprising an organic material.

The invention can improve the bonding reliability for the bonding portion between the electrode and/or wiring layer comprising a material selected from the group consisting of Ag, Au, Ni, Cu and alloys thereof of a semiconductor device and a bonding material comprising a fired layer of Cu particles as a main agent of bonding. Particularly, the invention provides an effect capable of obtaining the bonding portion described above also by heating at an extremely low temperature. The invention is applicable, particularly, to power conversion devices, hybrid cars using them, as well as other power source circuits.

In the invention, the bonding layer is preferably a fired layer of fine Cu particles formed from cupric oxide (CuO). Further, the particle size of Cu particles of the bonding layer is preferably extremely smaller than the particle size of a metal of the electrode. It is preferred that an oxide layer is not present substantially at the boundary between the bonding layer and the electrode by which a high bonding strength is maintained. Further, this is preferred in that the heat conductivity of the bonding layer is about from 50 to 430 W/mK thereby attaining a semiconductor device of good heat dissipation property. As the electrode, Cu or Ni which is used most frequently in the field of the semiconductor devices at present is used preferably. Also in the invention, the electrode or the wiring layer formed by such a metal is preferably used.

The bonding layer preferably comprises a fired layer obtained by heating, in a reducing atmosphere, a bonding material containing particles of cupric oxide with an average particle size of 1 nm to 50 μm and a reducing agent comprising an organic material. A paste formed by adding an organic solvent to the bonding material is suitable to apply or inject the bonding material to the bonded portion.

Further, the invention provides a semiconductor device having a ceramic insulative substrate, a wiring substrate bonded to the ceramic insulative substrate and having wiring layers on both surfaces, a semiconductor element connected to one of the surfaces of the wiring substrate, and a support member connected to the other surface of the wiring substrate in which a cover layer comprising Ni or Cu formed on the wiring layer connected with the semiconductor element and the semiconductor element are bonded by way of a bonding layer of metal particles comprising Cu, and the bonding layer and the cover layer of the wiring layer are diffusion-bonded to each other.

Further, the invention provides a method of manufacturing semiconductor device by applying a bonding material containing a cupric oxide and a reducing agent comprising an organic material to a semiconductor element, an electrode comprising a material selected from the group consisting of Cu, Ni, Au, Ag and alloys thereof, and a bonding surface of the semiconductor element and the electrode, heating the bonding surface including the bonding material in a reducing atmosphere and diffusing to form a Cu bonding layer comprising pure Cu, and Cu of the Cu bonding layer and the metal atoms of the electrode to each other, thereby bonding the electrode and the Cu bonding layer. In the method, the heating temperature is preferably from 50 to 500° C. and, particularly preferably, from 80 to 250° C.

The present invention provides a method of manufacturing semiconductor device having a ceramic insulative substrate, a wiring substrate bonded to the ceramic insulative substrate and having wiring layers on both surfaces thereof, a semiconductor element connected to one of the surfaces of the wiring substrate and a support member connected to the other surface of the wiring substrate, in which the method includes a step of applying a bonding material containing particles of cupric oxide and a reducing agent comprising an organic material to the surface of a cover layer comprising a metal selected from the group consisting of Ni, Cu, Au, Ag, and alloys thereof formed on the wiring layer connected with the semiconductor element, heating the same in a reducing atmosphere to form a Cu bonding layer comprising fine particles of Cu thereby diffusing-bonding the Cu bonding layer and the cover layer of the wiring layer to each other.

Further, the invention provides a composite metal body in which a metal material selected from the group consisting of Cu, Ni, Au, Ag, and alloys thereof and a fired Cu layer are bonded with Cu particles finer than the metal particles.

Further, the invention provides a method of manufacturing a composite metal body by applying a bonding material containing particles of cupric oxide and a reducing agent comprising an organic material to the surface of a metal material selected from the group consisting of Cu, Ni, Au, Ag, and alloys thereof, heating the surface in a reducing atmosphere, to convert the bonding material into a fired layer comprising metallic Cu, and forming a fired layer of Cu finer than the metal particle of the metal material on the surface of the metal material.

The invention provides a composite metal body by forming a Cu metal layer at a low temperature on a metal layer in addition to the manufacture of the semiconductor device. This is applicable, for example, to metallization of a metal. Further, the invention can provide a method of manufacturing a composite metal body of applying or placing a bonding material on the surface of a pair of metal base members and heating the bonding material and the metal base member in a reducing atmosphere.

Further, the invention can provide a method of manufacturing a semiconductor device in which at least one of the electrode of a semiconductor element and a wiring for taking out an electric signal of the semiconductor element to the outside comprises Cu or Ni and the electrode of the semiconductor element and the wiring are bonded, in which the method includes a step of applying a bonding material containing particles of cupric oxide with an average particle size of 1 nm to 50 μm and a reducing agent comprising an organic material to a bonding surface of the semiconductor element and the wiring, heating and firing the bonding material in a reducing atmosphere, and bonding the electrode and the wiring by way of the fired Cu layer. In the step of bonding the electrode and the wiring, it is preferred to apply a pressure of 0.01 to 5 MPa and heating at 50° C. to 500° C.

In the step of bonding the electrode and the wiring, it is preferred to heat the particles of Cu oxide to form Cu particles, fire them and diffuse Cu in the fired layer and the metal of the mating electrode or the wiring layer to each other.

The reducing agent comprising the organic material is preferably a member selected from alcohols, carboxylic acids, and amines, or a mixture of two or more of them. It is preferred to include a step of reducing the Cu particle precursor by heating to form a fired layer comprising metal particles with an average particle size of 100 nm or less.

The invention is based on the finding that an electrode or a wiring layer selected from the group consisting of Au, Ag, Ni, Cu, and alloys thereof or a cover layer formed on the bonding surface thereof and a bonding material containing particles of cupric oxide form a fired Cu layer in a reducing atmosphere, and the electrode, the wiring layer, or the cover layer and the Cu bonding layer bond strongly by diffusion to each other. On the contrary, it was confirmed that even by the use of a bonding material as a mixture of particles of cuprous oxide ($Cu_2O$) and a reducing agent comprising an organic material, diffusion-bonding with the mating material did not occur and the effect as in the case of using the particles of cupric oxide could not be obtained at all. As described above, this is an extremely important technical finding that cuprous oxide and cupric oxide show behaviors quite different from each other in the presence of the reducing agent comprising the organic material.

The invention is to be described specifically. In the bonding using the existent bonding material described in JP-A No. 2004-107728 having metal particles, for example, silver particles with an average particle size of 100 nm or less as a main agent for bonding, it was found that an oxide layer was formed to the surface of the Ni or Cu electrode upon bonding. This is considered that the oxide layer gives a factor for lowering the bonding strength. On the other hand, as a result of an earnest study made by the present inventors, it was found that excellent bonding strength was obtained also for the electrode or the wiring layer comprising Au, Ag, Ni, Cu, or alloys thereof by conducting bonding in a reducing atmosphere using a specified bonding material. That is, excellent bonding strength can be obtained to an Ni or Cu electrode by conducting bonding in a reducing atmosphere using a bonding material containing particles of cupric oxide (CuO) with an average particle size of 1 nm to 50 μm as a Cu particle precursor and a reducing agent comprising an organic material.

This bonding utilizes a phenomenon that the Cu particle precursor is reduced at a temperature lower than that for the heat decomposition of the Cu particle precursor alone by adding the reducing agent comprising the organic material to the Cu particle precursor (CuO), in which fine Cu particles with an average particle size of 100 nm or less are formed and Cu particles are fused to each other to form a fired layer thereby conducting bonding. Since the particles of cupric oxide start to form metal particles of 100 nm or less at a temperature of 200° C. or lower under the presence of the reducing agent, bonding can be attained even at a low temperature of 200° C. or lower which was difficult so far.

Further, since Cu particles with a particle size of 100 nm or less are formed in situ during bonding, preparation of metal particles protected at the surface with an organic material is no more necessary and it is possible to simplify the manufacturing and bonding process of the bonding material, as well as remarkably decrease the cost of the bonding material. Further, formation of the oxide layer for the Ni or Cu electrode can be suppressed by bonding in the reducing atmosphere or by the reducing effect of the reducing agent to attain firm metallic bonding between the Ni or Cu electrode or wiring layer and the Cu particles.

For manufacturing Cu particles of 100 nm or less, a Cu particle precursor (particles of cupric oxide) with an average particle size of 1 nm to 50 μm is used in the invention. The material is defined to cupric oxide because it has a high Cu content in the Cu particle precursor and, accordingly, causes less volumic shrinkage during bonding and because oxygen evolves during decomposition to promote oxidative decomposition of the organic material. The Cu particle precursor means herein a material that forms Cu particles and can be diffusion-bonded with another metal member to each other after mixing with the reducing agent and reduction by heating, that is, particles of cupric oxide.

The particle size of the Cu particle precursor used herein is defined as 1 nm to 50 μm in average particle size because as the average particle size of the Cu particles is more than 50 μm, Cu particles with a particle size of 100 nm or less are difficult to be prepared during bonding operation which increases gaps between the particles making it difficult to obtain a dense bonding layer. However, the invention has a feature in that Cu particles with a particle size smaller than that of the starting precursor particles are formed by heating and reducing treatment even when the particle size of the precursor is more than 100 nm of the aimed Cu particle.

Further, the average particle size is defined as 1 nm or more because it is difficult to actually prepare the Cu particle precursor with an average particle size of 1 nm or less. In the invention, since Cu particles with the particle size of 100 nm or less are formed by the reduction of the precursor during bonding operation, it is not necessary that the particle size of the Cu particle precursor is 100 nm or less. Use of particles with the particle size of 1 to 50 μm is preferred with a view point of preparation, handlability and the long time store of the Cu particle precursor. Further, for obtaining a more dense bonding layer, it is preferred to use a metal particle precursor with a particle size of 1 nm to 100 nm.

The Cu oxide particles include cupric oxide as described above. For the particles of cupric oxide, fine particles of metal oxides such as gold oxide or silver oxide ($Ag_2O$, AgO), etc. may be added within a range of the purpose of the invention and the amount is 50 mass % or less based on the entire metal oxide. Since such additives generate only oxygen during reduction, residues less remain after bonding, and the volume reduction ratio is also extremely small. Further, while cupric oxide is an essential ingredient in the invention, cuprous oxide ($Cu_2O$) may also be contained within a range not deteriorating the purpose of the invention. For example, while cuprous oxide may be contained by ⅕ or less, particularly, 1/10 or less of cupric oxide on the mass basis, it was experimentally confirmed that the content of cuprous oxide is preferably as less as possible and a best result is obtained in a case of using only cupric oxide.

In the present specification, terms of particles of Cu oxide or Cu particles are used in the meaning of Cu oxide particles, alone or containing other additive metal oxides or metal particles unless otherwise specified. Further, also the term of Cu particles means Cu particles alone or containing other additive metal particles. However, it is preferred that cupric oxide or copper particles derived from cupric oxide occupy 70% or more and, particularly, 90% or more of the metal mass of the bonding layer.

The content of the Cu particle precursor is preferably from 50 mass % to 99% mass % in the entire mass part of the bonding material (total amount for the metal oxide particles containing CuO and the reducing agent comprising an organic material). This is because more metal content in the bonding material can decrease the organic material residue after bonding at a low temperature making it possible to attain a dense fired layer and metallic bonding at the bonding boundary at a low temperature making it possible to improve the bonding strength and, further, form a bonding layer of high heat dissipation property and high heat resistance.

As the reducing agent comprising the organic material, a material selected from alcohols, carboxylic acids and amines, or a mixture of two or more of them can be used.

A compound containing alcohol groups that can be used includes alkyl alcohols, for example, ethanol, propanol, butyl alcohol, pentyl alcohol, hexyl alcohol, heptyl alcohol, octyl alcohol, nonyl alcohol, decyl alcohol, undecyl alcohol, dodecyl alcohol, tridecyl alcohol, tetradecyl alcohol, pentadecyl alcohol, hexadecyl alcohol, heptadecyl alcohol, octadecyl alcohol, nonadecyl alcohol, and icosyl alcohol. Further, not restricted only to the primary alcohols, secondary alcohols and tertiary alcohols such as ethylene glycol and triethylene glycol, and alkane diols, and alcohol compounds having a cyclic structure can also be used. In addition, compounds having four alcohol groups such as citric acid and ascorbic acid may also be used.

Further, the compound containing carboxylic acids that can be used include alkyl carboxylic acids. They include, specifically, for example, butanoic acid, pentanoic acid, hexanoic acid, heptanoic acid, octanoic acid, nonanoic acid, decanoic acid, undecanoic acid, dodecanoic acid, tridecanoic acid, tetradecanoic acid, pentadecanoic acid, pentadecanoic acid, hexadecanoic acid, heptadecanoic acid, octadecanoic acid, nonadecanoic acid, and icosanic acid. Further, like the compounds containing the alcohol groups described above, they are not restricted to primary carboxylic acids but secondary carboxylic acid, tertiary carboxylic acid, dicarboxylic acids and carboxyl compounds having a cyclic structure can also be used.

Further, the compounds containing amino groups that can be used include alkylamines. They include, for example, butylamine, pentylamine, hexylamine, heptylamine, octylamine, nonylamine, decylamine, undecylamine, dodecylamine, tridecylamine, tetradecylamine, pentadecylamine, hexadecylamine, hapetadeclamine, octadecylamine, nonadecylamine, and icodecylamine. Further, the compounds having the amino groups may also have a branched structure and they include, for example, 2-ethylhexylamine, and 1,5-dimethylhexylamine. Further, not restricted only to the primary amines, secondary amines and tertiary amines can also be used. Further, such organic materials may have a cyclic structure.

Further, the reducing agent to be used is not restricted to the organic materials containing alcohols, carboxylic acids, and amines, but organic materials containing aldehyde groups, ester groups, sulfanyl groups, ketone groups, etc. may also be used.

A reducing agent which is liquid at 20 to 30° C., for example, ethylene glycol or triethylene glycol has to be used just after mixing with CuO since it reduces CuO to Cu after one day when left in a mixed state therewith. On the other hand, since myristyl alcohol, lauryl amine, ascorbic acid, etc. which are solid in a temperature range from 20 to 30° C. do not proceed reaction remarkably even when left for about one day together with metal oxide or the like, they are excellent in the storability and used preferably in a case where they are stored for a long time after mixing.

Further, since the reducing agent acts as a protective film for purified metal particles having a particle size of 100 nm or less after reducing the metal oxide or the like, it is preferred that the reducing agent has carbon atoms to some extent. Specifically, the number of carbon atoms is preferably from 2 to 20. If it is less than 2, growing of particle size occurs simultaneously with the preparation of the metal particles making it difficult to prepare metal particles of 100 nm or less. Further, if it is more than 20, the decomposing temperature increases and the sintering of the metal particles less occurs to result in lowering of the bonding strength.

The amount of the reducing agent to be used may be within a range of from 1 mass % to 50 mass % based on the entire mass of the Cu particle precursor. When the amount of the reducing agent is less than 1 mass %, this is not sufficient to entirely reduce the metal particle precursor in the bonding material to prepare metal particles. Further, when it is used in excess of 50 mass %, residues after bonding increase making it difficult to attain metallic bonding at the boundary and densification in the copper bonding layer. A preferred range of the reducing agent is from 10 to 60 mass %.

Further, the weight loss of heating of the reducing agent upon heating up to 500° C. is preferably 99% or more. When the decomposing temperature of the reducing agent is higher, residues after bonding increase making it difficult to attain metallic bonding at the boundary and the densification in the copper bonding layer. Measurement for the weight loss of heating during heating up to 500° C. is conducted in atmospheric air at 10° C./min using a commercially available TG/DTA 6200 manufactured by Seiko Instruments Inc. or TGA-50 manufactured by Shimadzu Corporation.

The combination of the metal particle precursor and the reducing agent comprising the organic material is not particularly restricted so long as metal particles can be prepared by mixing them and a combination of not forming metal particles at a normal temperature is preferred with a viewpoint of storability as the bonding material.

Further, in the bonding material, particles of cupric oxide with a relatively large particle size, that is, from 50 μm to 100 μm in average particle size may be used in admixture. This is because Cu particles of 100 nm or less formed during bonding serve to sinter Cu particles with an average particle size of 50 μm to 100 μm to each other. Further, Cu particles with a particle size of 100 nm or less may be mixed previously with the bonding material.

As the kind of the metals that can be added to the particles of cupric oxide, at least one metal selected from gold, silver, platinum, palladium, rhodium, osmium, ruthenium, iridium, iron, tin, zinc, cobalt, nickel, chromium, titanium, tantalum, tungsten, indium, silicon, aluminum, etc. or alloys comprising two or more of such metals can be used. It is preferred that gold, silver, or copper is 30 mass % or less, particularly preferably, 10 mass % or less and other metal is 10 mass % or less, and, particularly preferably, 5 mass % or less based on the mass of metal ingredients.

As the bonding material used in this embodiment, only the Cu particle precursor and the reducing agent comprising the organic material may be used but a solvent may also be added in a case of use as a paste form.

When it is used just after mixing, those having a reducing effect such as alcohol as for example, methanol, ethanol, propanol, ethylene glycol, triethylene glycol, and terpineol may be used. In a case of storing the material for a along time, those showing weak reducing effect at a normal temperature such as water, hexane, tetrahydrofuran, toluene and cyclohexane may be used preferably. Further, when a solvent causing less reduction at a normal temperature such as myristyl alcohol is used as the reducing agent, this can be stored for a long time. However, in a case of using a solvent having a strong reducing effect such as ethylene glycol, this is preferably used being mixed upon use.

Further, for improving the dispersibility of the Cu particle precursor to the solvent, a dispersant may be used optionally to cover the periphery of the metal particle precursor with the organic material to improve the dispersibility. The dispersant used in the invention includes, for example, polyvinyl alcohol, polyacrylonitrile, polyvinyl pyrrolidone, and polyethylene glycol, as well as commercial dispersants, for example, polymeric dispersants such as disperbyk 160, disperbyk 161, disperbyk 162, disperbyk 163, disperbyk 166, disperbyk 170, disperbyk 180, disperbyk 182, disperbyk 184, and disperbyk 190 (manufactured by BYK Japan KK.), MAGAFACK F-479 (DAINIPPON INK AND CHEMICALS, INCORPORATED) SOLSPERSE 20,000, SOLSPERSE 24,000, SOLSPERSE 26,000, SOLSPERSE 27,000 and SOLSPERSE 28,000 (manufactured by Avecia Co.) can be used. The amount of the dispersant to be used is within a range of 0.01 mass % or more and not exceeding 45 mass % based on the Cu particle precursor in the bonding material.

The method of applying the paste material includes a method of jetting out a paste from a fine nozzle by an ink jet process and coating the same to a connection portion of an electrode or electronic part on a substrate, a method coating only for a necessary portion by using a metal mask or mesh-like mask opened at a coating portion, or a method of coating a necessary portion by using a disperser. Further, there is also a method of coating a water repellent resin including silicone or fluorine by using a metal mask-like or mesh mask opened only at a necessary portion, a method of coating a photosensitive water repellent resin on a substrate or an electronic part, conducting exposure and development to remove a portion of coating a paste containing fine particles of cupric oxide and then coating the bonding paste to the open portion. There is also a method of coating a water repellent resin on a substrate or an electronic part, then removing the paste coated portion comprising the metal particles by a laser, and then coating a bonding paste to the open portion thereof.

The coating methods described above may be combined in accordance with the area and the shape of the electrode to be bonded. Further, in a case of using those which are solid at a normal temperature such as myristyl alcohol or ascorbic acid as the reducing agent, there is a method of mixing the same with the Cu particle precursor and applying pressure to form into a sheet-like shape and using the same as the bonding material.

An example of the bonding process is shown in the flow chart of FIG. 12. As shown in the flow chart, a paste prepared by mixing a CuO powder and a reducing agent comprising an organic material and, optionally, a solvent is applied to a bonding surface of a Cu electrode or an Ni electrode and dried, the bonding surface is positioned and then set in a reducing furnace. The inside of the reducing furnace is replaced with a hydrogen atmosphere, and heated to sinter the bonding layer and then the inside of the reducing furnace is replaced with a nitrogen atmosphere and cooled.

The cross section of the bonding portion obtained as described above was observed under a microscope. The result is shown as a texture view for the bonding portion in FIG. 13A and FIG. 13B. FIG. 13A shows the texture of a sintered pure copper layer and an underlayer Ni or Cu metal. FIG. 13B shows further details for the boundary between the sintered Cu layer and the underlayer. As apparent from FIGS. 13A and 13B, in the bonding portion of the invention, pure Cu bonding layer and an underlayer Cu or Ni are diffusion-bonded to each other and connected. The Cu particles in the fired Cu layer are fine particles with the particle size of about ⅕ or less of the crystal particle size of the underlayer Cu or Ni. Then, a mutual diffusion region with a thickness of about 0.1 to several 10 nm is observed at the bonding boundary thereof. On the contrary, when only the particles of cuprous oxide are used as the bonding material, no mutual diffusion layer was observed for the bonding boundary.

In the case of the invention, no heterogeneous phase such as an oxide was not found at the boundary layer and the bonding strength represented by shearing strength (relative value) was quite satisfactory as shown FIG. 4. Further, it was also confirmed that the Cu particles in the bonding layer were crystal particles extremely smaller than the crystal particles of Cu or Ni as the underlayer.

In the bonding using the bonding material of the invention it is preferred to form Cu particles with the particle size of 100 nm or less from the Cu particle precursor during bonding, and apply heat and pressure for conducting metallic bonding by fusion of metal particles with the particle size of 100 nm or less while discharging the organic material in the bonding layer. Further, it is essential to conduct bonding in the reducing atmosphere for attaining mutual diffusion-bonding with the Ag, Au, Ni or Cu electrode. As the bonding condition, it is preferred to apply heating at 50° C. to 400° C. at a temperature from 0.01 to 10 MPa for 1 sec to 10 min.

In the bonding of the invention, the particles of Cu oxide form super micro pure Cu particles which are not oxide with the particle size of about 0.1 to 50 nm by heating upon bonding, and the super micro pure Cu particles fuse to each other into a bulk. This provides a feature that the melting temperature after forming the bulk is identical with the melting temperature of Cu or alloys thereof in a usual bulk state, and super micro pure Cu or alloy particles are melted by heating at a low temperature and not re-melted after the melting until they are heated to the melting temperature in the state of the bulk. Since bonding can be conducted at a low temperature in a case of using super micro pure Cu or alloy thereof and the melting temperature increases after bonding, this can provide an advantage that the bonded portion is not melted again upon subsequent bonding of other electronic parts.

Further, the heat conductivity of the bonding layer after bonding can be from 50 to 430 W/mK and the heat dissipation property is also excellent. Further, since the precursor is Cu oxide, it also has an advantage of low cost. Further, it is preferred to coat the organic material such as an alcohol to the particles of Cu oxide for promoting the reducing effect. Further, it is necessary that the atmosphere during bonding is a reducing atmosphere. As the reducing atmosphere, atmosphere, for example, of hydrogen or hydrogen-nitrogen, hydrogen-argon, or hydrogen-helium can also be used.

At the boundary bonded by the bonding material and by way of the bonding method, an oxide layer that may hinder the metallic bonding is not substantially formed. Cu particles formed by reduction are put to metallic bonding with a mating material by bonding, which is necessary for enhancing the bonding strength and ensuring the electric conduction. Naturally, it is necessary also for the mating property to be put to metallic bonding with Cu that forms the Cu particles. For this purpose, the mating member is preferably formed of a material causing metallic bonding with the metal particles.

The mating member comprising Ni or Cu, or an alloy comprising the same as a main ingredient causes metallic bonding by mutual diffusion bonding during bonding between the Cu particles and the mating member. In a case where silver oxide and cupric oxide are present in admixture, bonding can be conducted in the same manner as described above and it also has an advantage capable of improving the corrosion resistance.

By using the bonding material and the bonding method described above for the bonding of the Ni or Cu electrode of the semiconductor device or the wiring layer, excellent bonding reliability can be obtained.

Embodiments of the invention are to be described with reference to the drawings but the invention is not restricted to the following embodiments.

BRIEF DESCRIPTION OF THE DRAWINGS

FIG. 4 is a graph showing the bonding property (shearing strength in relative value) for a bonding portion according to the invention and a bonding portion according to a comparative method.

DETAILED DESCRIPTION OF THE PREFERRED EMBODIMENTS

Figure 1A:
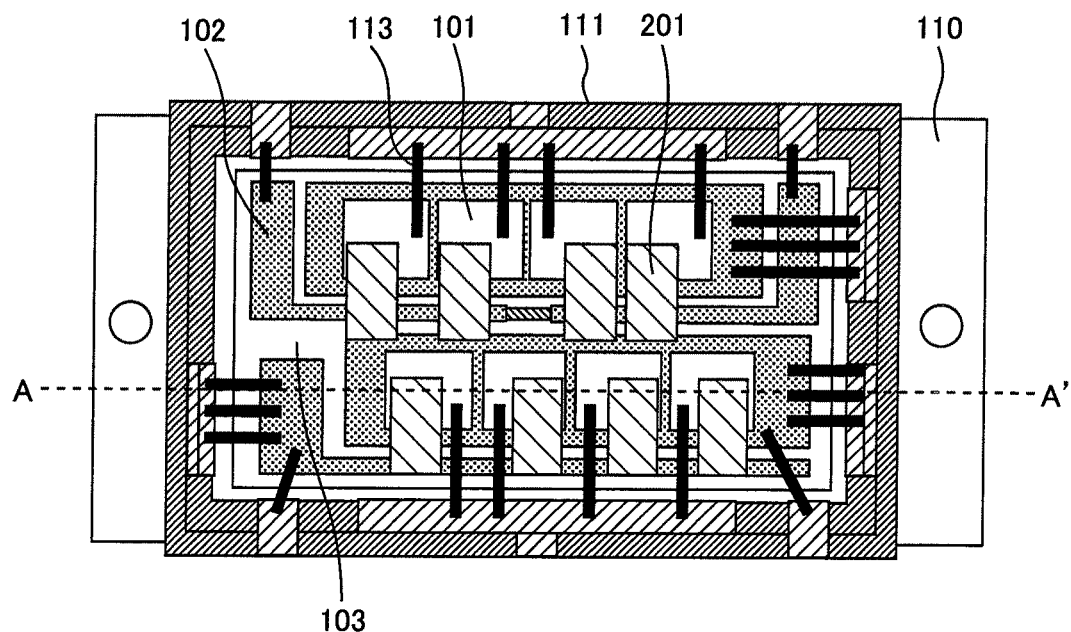
FIG. 1A is a plan view of an insulated semiconductor device according to an embodiment of the invention.
Figure 1B:
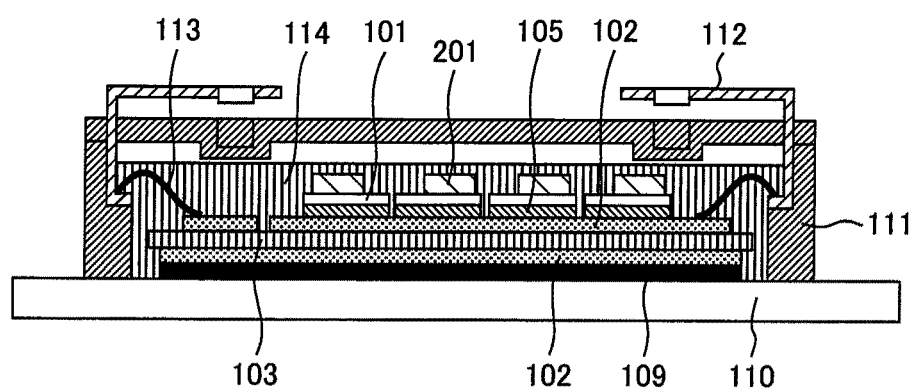
FIG. 1B is a cross sectional view along line A-A in FIG. 1A.

FIGS. 1A and 1B show an insulated semiconductor device of applying the invention. FIG. 1A is a plan view and FIG. 1B is a cross sectional view along line A-A' in FIG. 1A.

Figure 2:
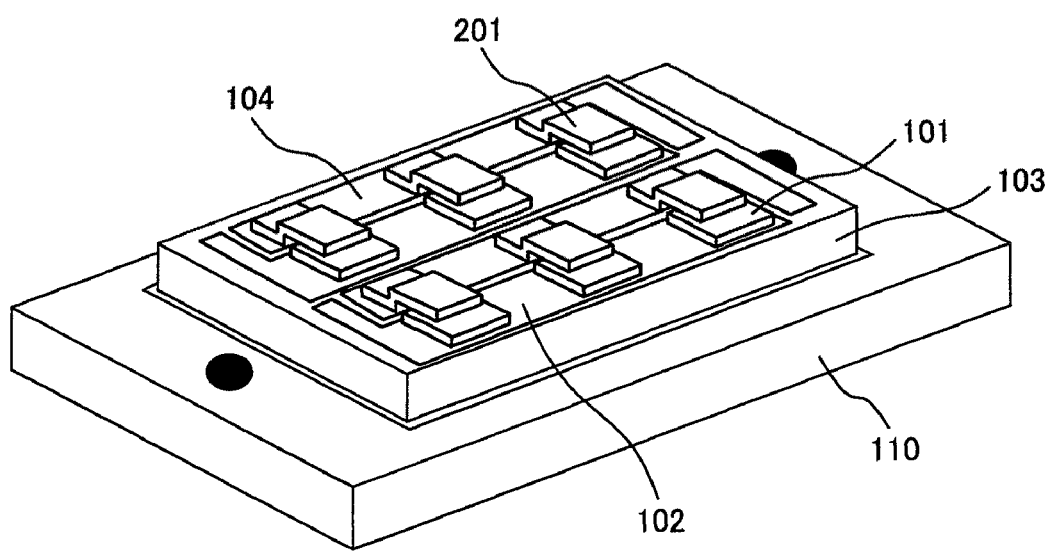
FIG. 2 is a perspective view showing a main portion in FIGS. 1A and 1B.

FIG. 2 is a perspective view showing a main portion in FIGS. 1A and 1B.

In this embodiment, on one side of a semiconductor element 101, a collector electrode 106' is bonded to a wiring layer 102 on a ceramic insulative substrate 103 by using a bonding layer (containing 5 wt % of myristyl alcohol, comprising pure Cu after bonding) 105 using particles of cupric oxide. The ceramic insulative substrate 103 is bonded to a support member 110 by way of a solder layer 109. The ceramic insulative substrate 103 and the wiring layer 102 are referred to as a wiring substrate.

The wiring substrate 102 has a Cu wiring layer applied with Ni plating. The thickness of the bonding layer 105 is 80 μm. On the other side of the semiconductor device 101, an emitter electrode is bonded by using a connection terminal 201 and a bonding material using particles of cupric oxide (formed into pure Cu after bonding), and the connection terminal 201 is bonded to a wiring layer 104 on the ceramic insulative substrate 103 by using a bonding material using particles of cupric oxide (formed into pure Cu layer after bonding). Other references numeral in FIGS. 1A and 1B denote, respectively, casing 111, external terminal 112, bonding wire 113, and sealing material 114.

Figure 3A:
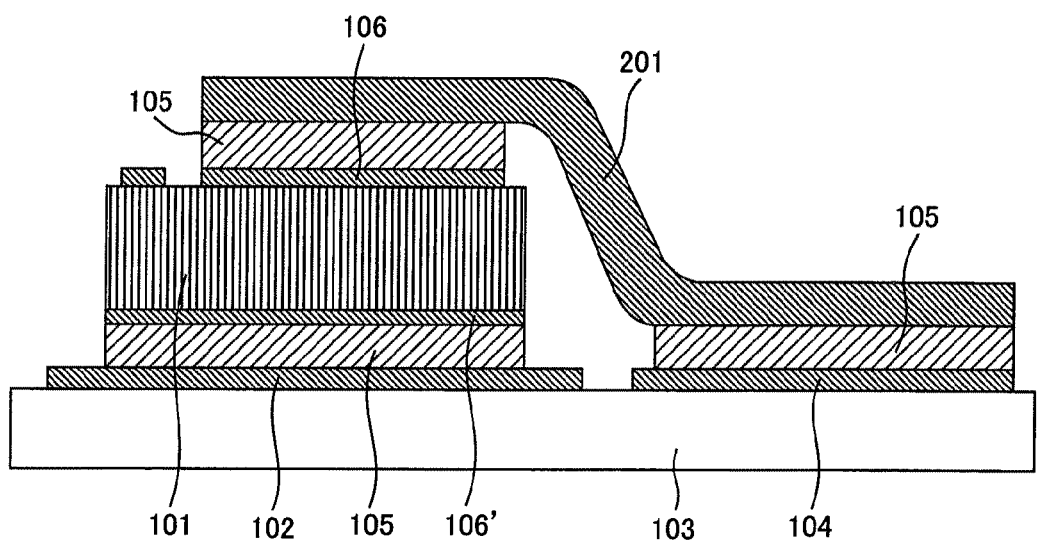
FIGS. 3A and 3B are cross sectional views shown, in an enlarged scale, a semiconductor device mounting portion in FIGS. 1A and 1B.
Figure 3B:
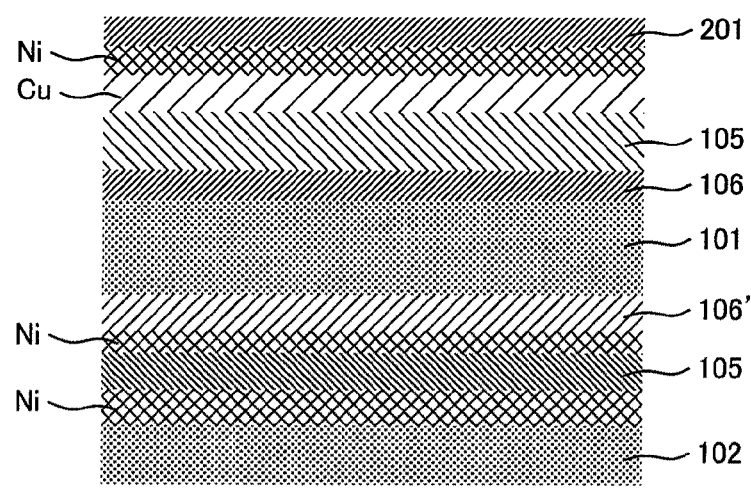

FIG. 3A is a cross sectional view showing, in an enlarged scale, a semiconductor element mounting portion in FIGS. 1A and 1B, and FIG. 3B is a cross sectional view shown, in an enlarged scale, details for the bonding portion thereof. The collector electrode 106' of the semiconductor element 101 and the wiring layer 102 are bonded by a bonding material 105 using particles of cupric oxide (formed into a pure Cu after bonding). The wiring layer 102 comprises a Cu wiring applied with Ni plating. The bonding material 105 using particles of cupric oxide (formed into pure Cu layer after bonding) is applied also to the bonding portion between the emitter electrode 106 of the semiconductor element and the connection terminal 201 and the bonding portion of the connection terminal 201 and the wiring layer 104 in the same constitution.

Ni is applied to the surface of the collector electrode 106' and the surface of the emitter electrode 106. Further, the connection terminal 201 is formed of Cu or a Cu alloy. Respective bonding with the particles of cupric oxide may be conducted individually or conducted simultaneously. The bonding material using particles of cupric oxide (mixture of fine powder of cupric oxide, organic reducing agent and, optionally, solvent) is disposed between the materials to be bonded by a method of coating or injection, and bonding can be conducted by applying a heat at 250° C. for about one min and, simultaneously, applying a pressure at 1.0 MPa in 100% hydrogen in this state. Ultrasonic vibrations may also be applied upon bonding.

FIG. 4 shows the result of evaluation for the bonding strength conducted to the bonding portion of the invention, which shows the result of investigating on the effect of the mating electrode and the heating atmosphere during bonding while setting constant the bonding temperature at 250° C. and a pressure at 1.0 MPa. In this evaluation, bonding to Ag, Au, Ni, and Cu electrodes were conducted respectively in atmospheric air and in a reducing atmosphere using particles of cupric oxide with the average particle size of 2 μm containing 5 wt % of myristyl alcohol. In FIG. 4, the ordinate shows a shearing strength, which is normalized based on the value for the Ni electrode in hydrogen.

As a result, bonding in atmospheric air using particles of cupric oxide could not provide good bonding strength to Ag, Ni, Cu, and Au electrodes. On the other hand, in a case of bonding in the reducing atmosphere, sufficient bonding strength could be obtained to any of the Ag, Ni, Cu, and Au electrodes. It can be seen from the result of the evaluation that a sufficient reducing effect for cupric oxide could be provided sufficiently by myristyl alcohol.

Further, under the same bonding conditions, evaluation was conducted also for the bonding to Ag, Ni, Cu and Au electrodes in atmospheric air and in a reducing atmosphere by using the bonding material containing only the reducing agent (myristyl alcohol) and cuprous oxide ($Cu_2O$). As a result, as shown in FIG. 5, the bonding material using cuprous oxide did not form good bonding layer with the electrode both in the atmospheric air and the reducing atmosphere.

From the result described above, it was found that bonding to the Ni and Cu electrodes is possible by conducting bonding in the reducing atmosphere by using the bonding material containing the fine particles of cupric oxide and the reducing agent comprising the organic material.

Figure 5:
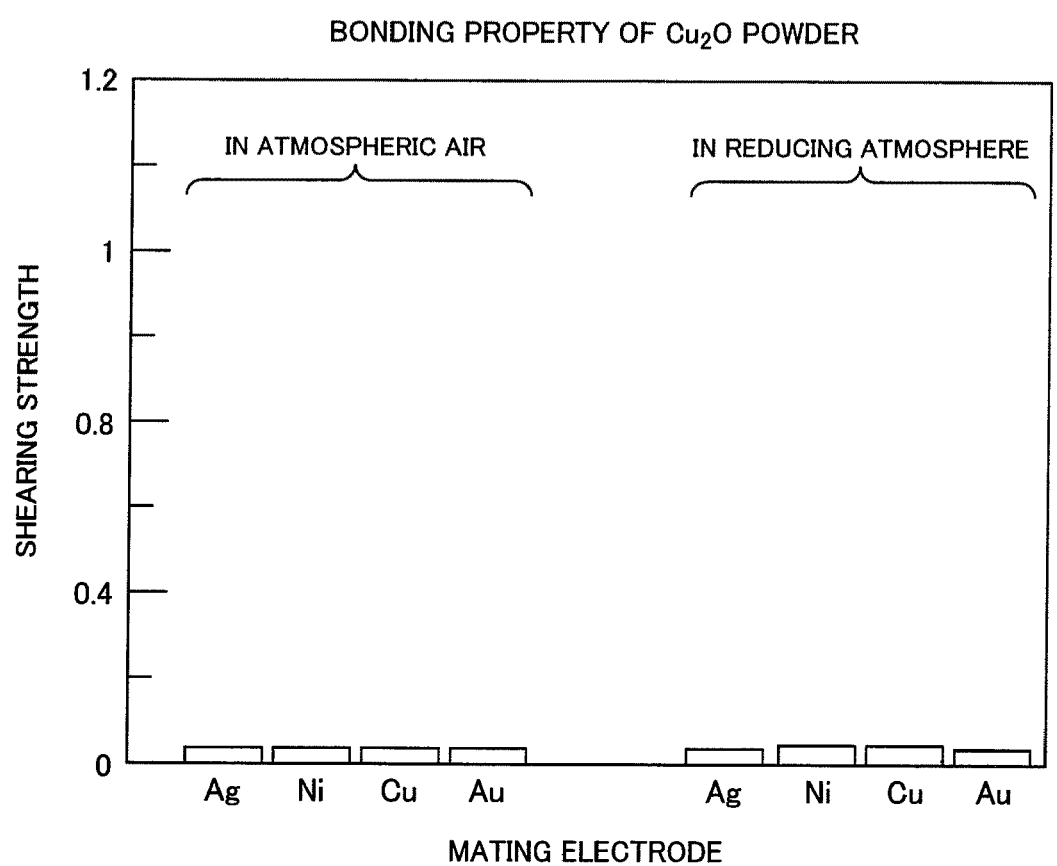
FIG. 5 is a graph showing the state of a bonding portion (shearing strength in relative value) by a comparative method.
Figure 6:
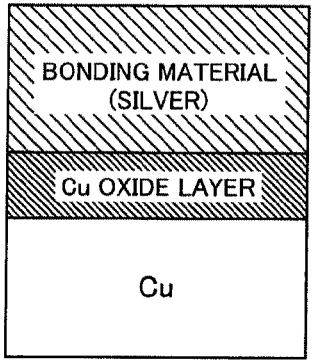
FIG. 6 is a schematic view for explaining the state of a bonding portion by the method according to the invention and an existent example.

FIG. 6 is a view showing the state for the cross section of the bonding portion in FIG. 4 and FIG. 5. In the existent method described in JP-A No. 2004-107728, an oxide layer was formed at the boundary to hinder the formation of the metallic bonding. On the contrary, in the method according to the invention, it was found that metallic bonding (mutual diffusion bonding) can be attained with no hindrance for the bonding at the boundary to Ni, Cu, etc.

Then, description is to be made to a preferred embodiment of a semiconductor device according to this embodiment.

The bonding layer 105 with fine Cu particles shown in FIGS. 3A and 3B is a portion where current flows. Accordingly, use of cupric oxide for the material of the particle layer is effective. A mixed material of silver oxide and cupric oxide may also be used. Also in this case, by the reducing effect upon heating (combined use of the reducing function with the organic material such as an alcohol and the reducing atmosphere), the formed nano size particles are bonded with the mating electrode and the bonding in this case can be conducted even at 200° C. or lower.

Since the heat expansion coefficient of Cu or alloys thereof is about 8 to 16 ppm/° C., silicon nitride is used preferably for the ceramic insulative substrate 103 shown in FIGS. 3A and 3B. The heat expansion coefficient of silicon nitride is about 9 ppm/° C. Further, the solder layer (not illustrated) may be a bonding layer using an oxide, which is a desired constitution for improving the heat dissipation property.

In the power semiconductor module of the structure in this embodiment, since the semiconductor element 101 and the insulative wiring substrate with a heat expansion coefficient of about 9 ppm/° C. are bonded by way of a bonding material with a heat expansion coefficient of 8 to 16 ppm/° C., it is possible to decrease the thermal stress caused by the difference of the heat expansion between each of the materials which becomes conspicuous at a high temperature circumstance. By aligning the heat expansion coefficient of the bonding material ideally with that of the wiring substrate, the thermal stress caused to the bonding material is minimized to improve the long time reliability.

The semiconductor device of the invention is applicable to various types of power conversion devices. By applying the semiconductor device of the invention to the power conversion device, it is possible to mount the conversion device to a place in a high temperature circumstance and ensure long time reliability without providing an exclusive cooler.

Figure 7:
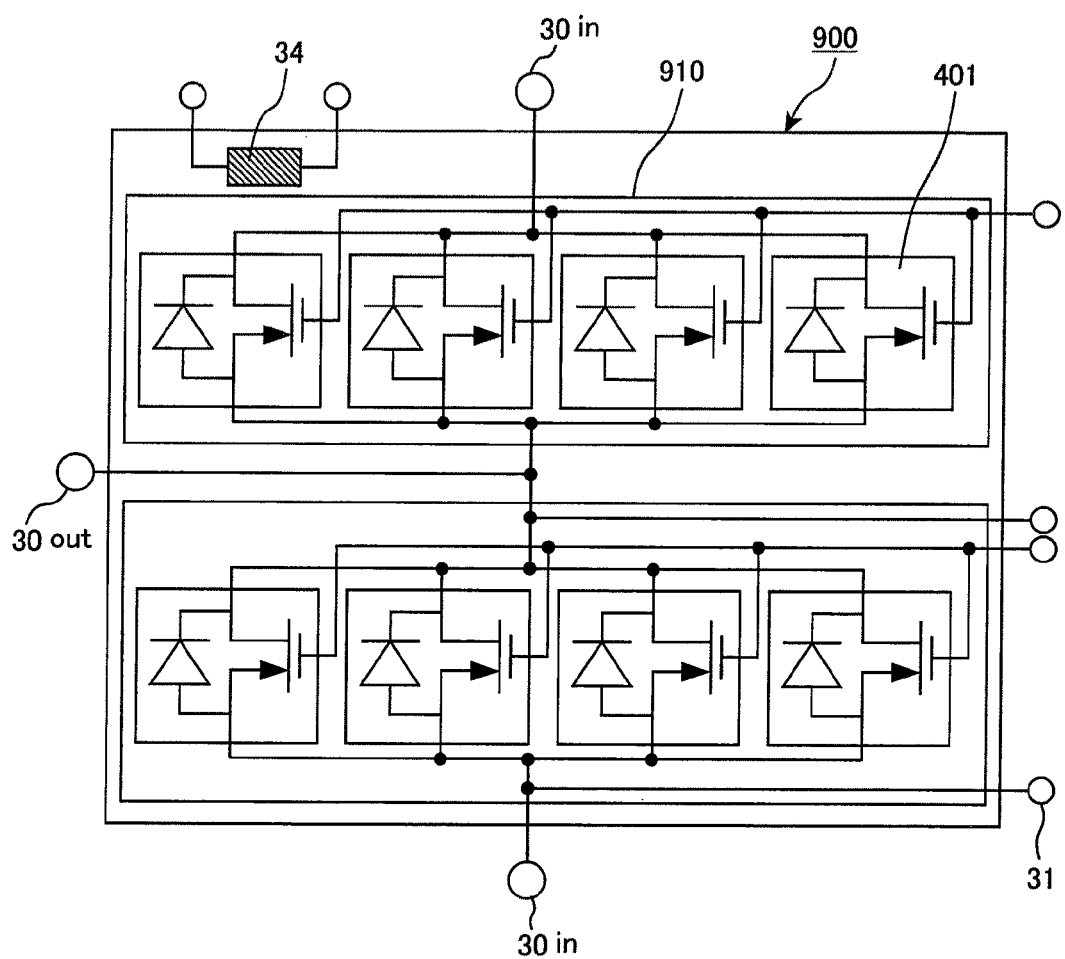
FIG. 7 is a schematic circuit diagram of applying a semiconductor device according to the invention to an electronic circuit.

FIG. 7 is a view for explaining the circuit of a semiconductor device to which the invention is applied. It has two systems of blocks 910 in which four MOS FET elements 401 are disposed in parallel. Each of the blocks 910 is connected in series, in which input main terminal 30 in, output main terminal 30 out, and auxiliary terminal 31 are led out from predetermined portions to constitute a main portion of a semiconductor device 900. Further, a thermistor 34 for detecting the temperature during operation of the circuit is disposed independently in the semiconductor device 900.

Figure 8:
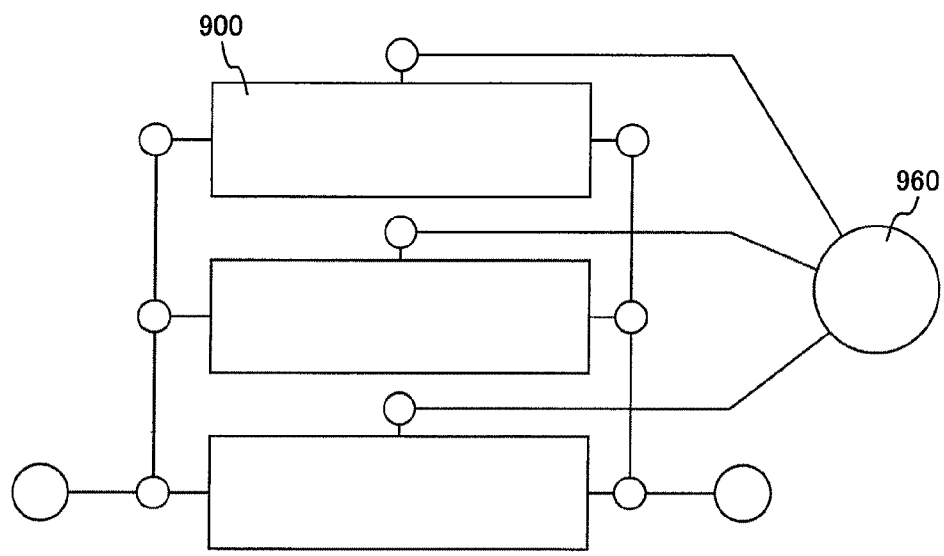
FIG. 8 is a schematic circuit diagram showing an inverter device for controlling the number of rotation of a hybrid car motor.
Figure 9:
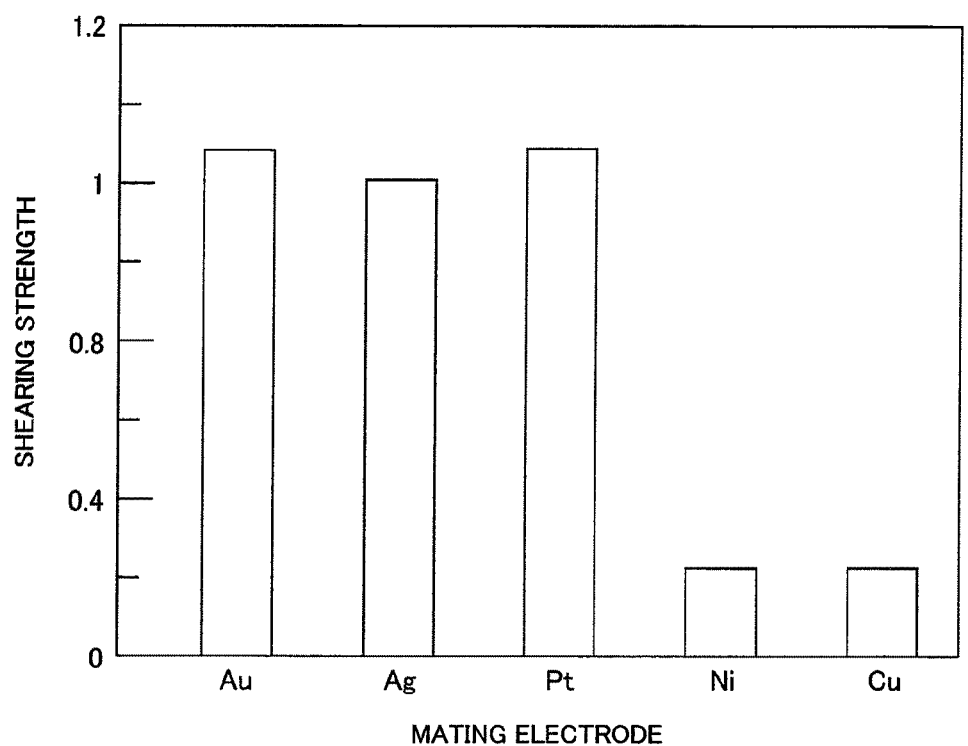
FIG. 9 is a graph showing the bondability of a bonding portion using fine silver particles to various metals.
Figure 10:
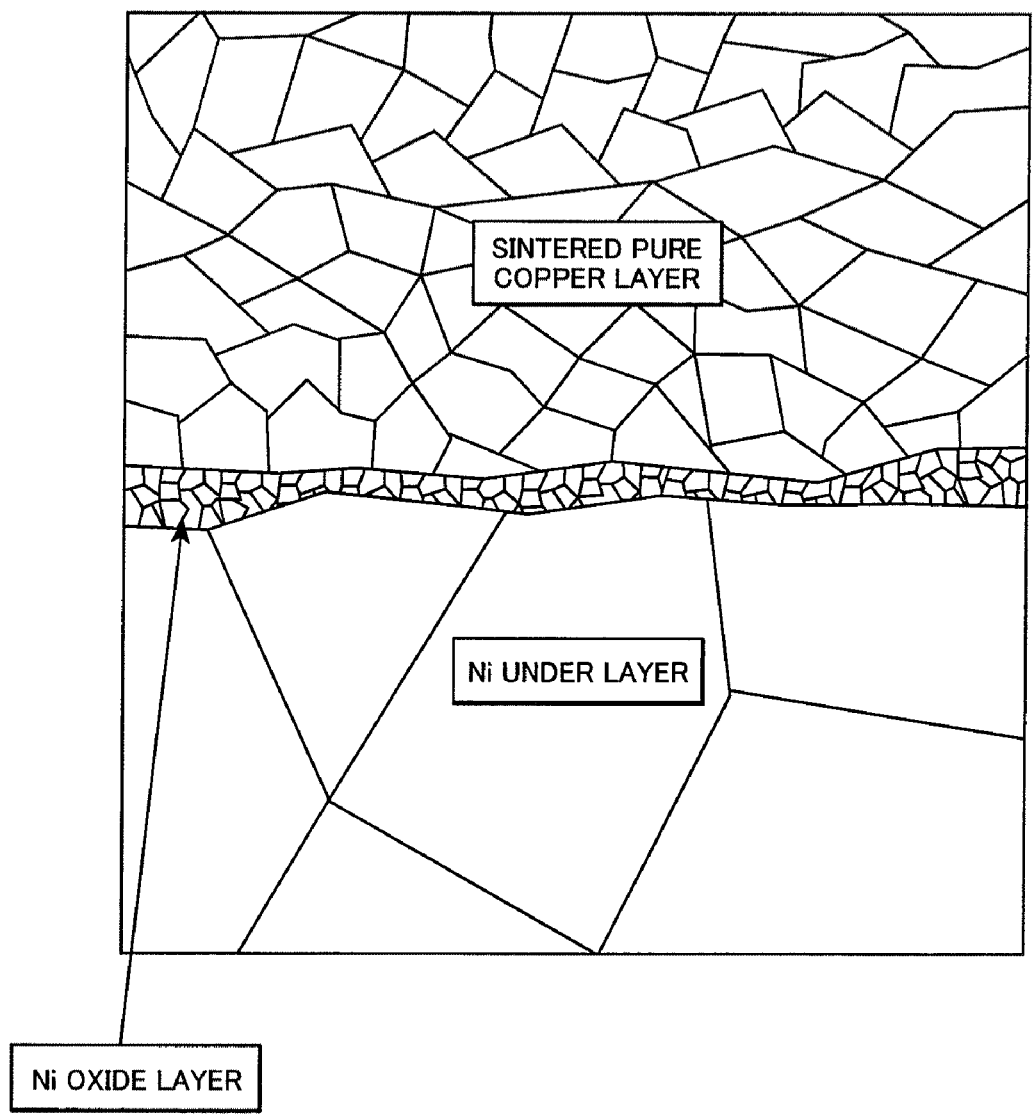
FIG. 10 is a schematic view showing the cross sectional structure of a bonding portion according to an example of a method described in JP-A No. 2004-107728.
Figure 11:
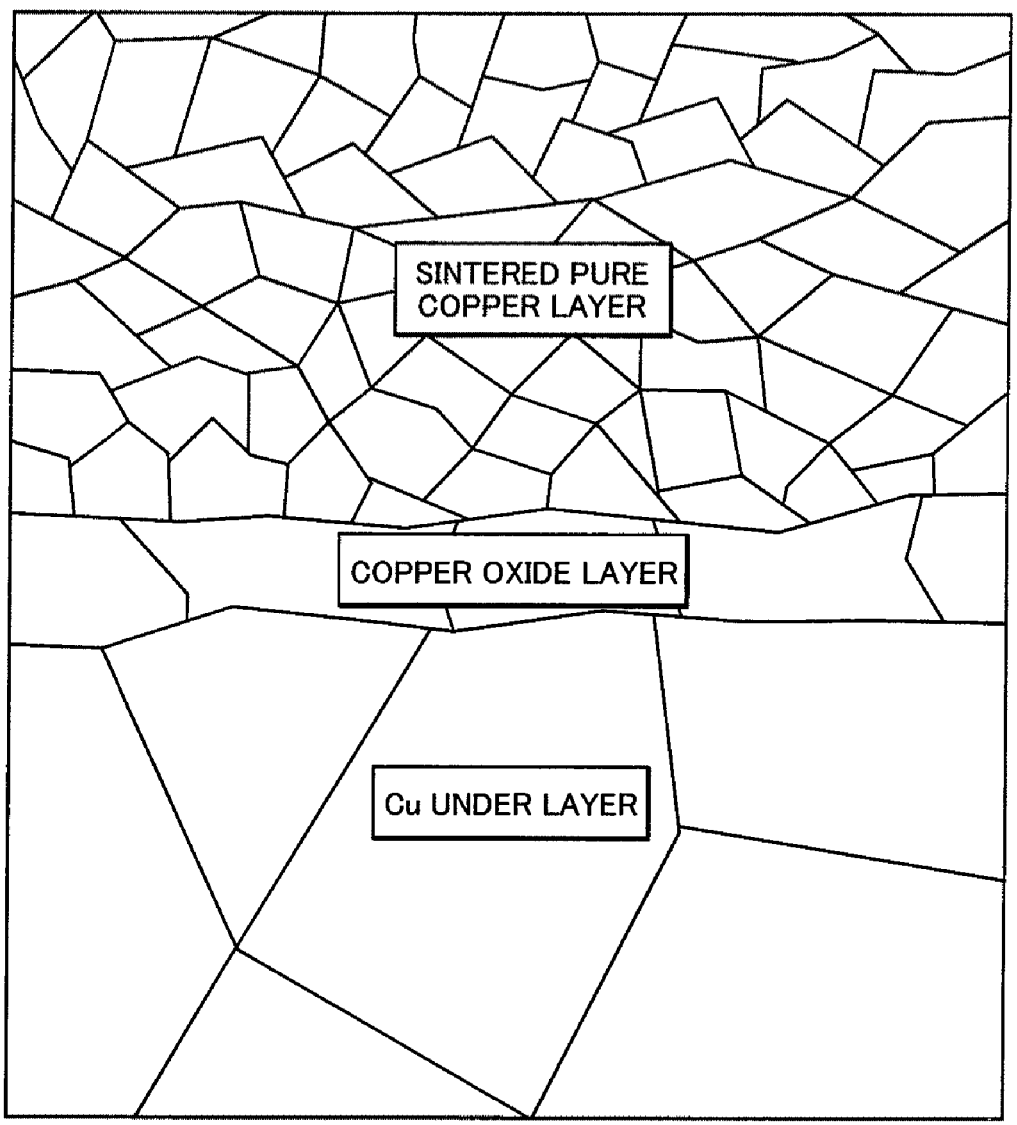
FIG. 11 is a schematic view showing the cross sectional structure of a bonding portion according to another example of a method described in JP-A No. 2004-107728.
Figure 12:
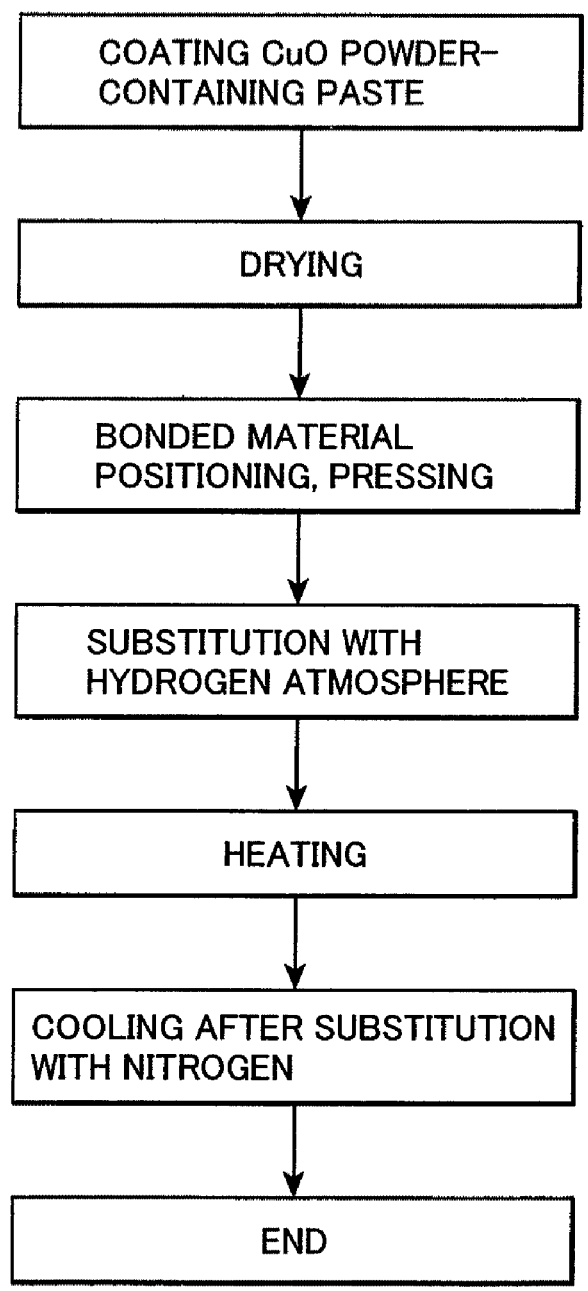
FIG. 12 is a flow chart showing an example of a bonding method according to the invention.
Figure 13A:
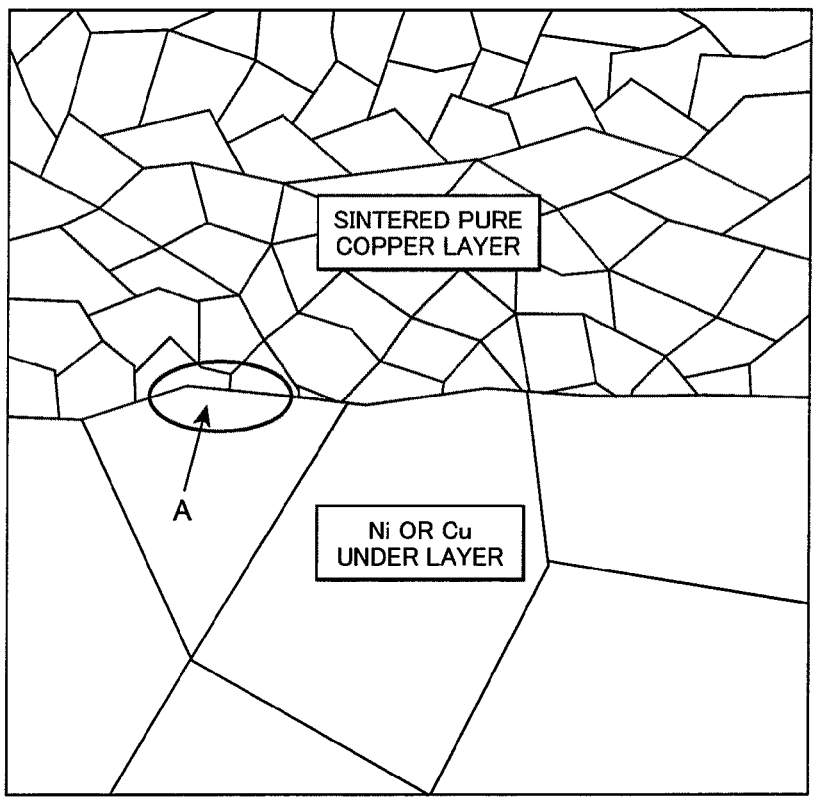
FIGS. 13A and 13B are schematic views showing a cross sectional structure of a bonding portion according to an embodiment of the invention.
Figure 13B:
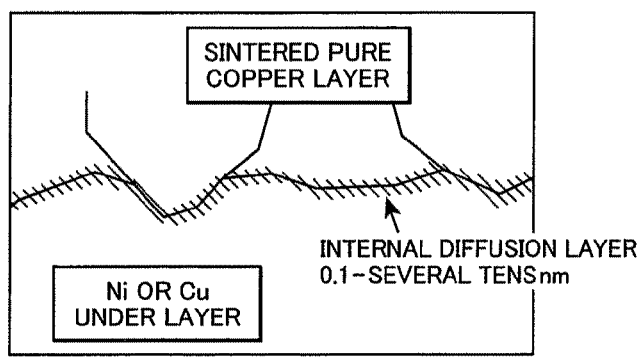

Further, an inverter device and a motor can be incorporated into an electric car as a power source thereof. In the car, since the driving mechanism from the power source to wheels can be simplified, shocks upon gear change can be moderated compared with existent cars that shift gears due to the difference of the gear engaging ratio, thereby enabling smooth running and also decreasing vibrations and noises than usual. Further, the semiconductor device 900 of this embodiment can be incorporated into an inverter device for controlling the number of rotation of a hybrid car motor 960 shown in FIG. 8.

Further, the inverter device incorporating the semiconductor device 900 of this embodiment can be incorporated into a cooling/heating apparatus. In this case, higher efficiency can be obtained than in a case of using an existent AC motor. This can decease the power consumption during use of cooling/heating apparatus. Further, the time that the temperature in a room reaches a set temperature from the start of the operation can be shortened than in a case of using the existent AC motor.

The same effect as in this embodiment is also applicable to a case where the semiconductor device 900 is incorporated in other apparatus for stirring or fluidizing fluids, for example, laundry machines and fluid circulation apparatus. The bonding material of the super fine Cu particles of the specification of the invention is applicable also to the bonding for a portion where heat generation is large as in an LED backlight.

What is claimed is:

1. A semiconductor device comprising a semiconductor element, an electrode comprising a material selected from the group consisting of Cu, Ni, and alloys thereof, a bonding layer for bonding the semiconductor element to the electrode and a diffusion layer containing Cu and Ni or Cu, which is formed between the bonding layer and the electrode by mutual diffusion of Ni in the electrode and Cu in the bonding layer or Cu in the electrode and Cu in the bonding layer, wherein an oxide layer is not substantially present at the boundary between the bonding layer and the electrode.

2. A semiconductor device according to claim 1, wherein the bonding layer is a fired layer of fine Cu particles.

3. A semiconductor device according to claim 1, wherein the particle size of the Cu of the bonding layer is smaller than the particle size of the metal of the electrode.

4. A semiconductor device according to claim 1, wherein the heat conductivity of the bonding layer is from 50 to 430 W/mK.

5. A semiconductor device according to claim 1, wherein the bonding layer is a fired layer in which Cu particles are metallurgically bonded to each other.

6. A semiconductor device according to claim 1, wherein the bonding layer comprises a fired layer obtained by heating a bonding material containing particles of cupric oxide with an average particle size of from 1 nm to 50 μm and a reducing agent comprising an organic material in a reducing atmosphere.

7. A semiconductor device according to claim 1, further comprising a wiring substrate including wiring layers on both sides of a ceramic insulative substrate, wherein the semiconductor element is connected to one of the surfaces of the wiring substrate, and a support member connected to the other surface of the wiring substrate in which a cover layer formed of Ni or Cu formed on the wiring layer connected with the semiconductor element and the semiconductor element are bonded by way of a bonding layer of metal particles comprising Cu, and the bonding layer and the cover layer of the wiring layer are diffusion-bonded to each other.

8. A semiconductor device according to claim 7, wherein the bonding layer comprises a fired layer comprising Cu particles which are finer than the metal particles of the cover layer.

9. A power conversion device mounting one or a plurality of semiconductor devices according to claim 7.

10. A hybrid car in which a power conversion device according to claim 9 is mounted in an engine compartment.

11. A semiconductor device according to claim 1, wherein the bonding layer consists essentially of Cu.

12. A semiconductor device comprising a semiconductor element,
an electrode bonded to the element by means of a bonding layer made from fired copper oxide particles having a particle size smaller than that of the metal of the electrode, wherein the electrode is made of Cu, Ni and their alloys, and the bonding layer is bonded to the electrode by means of a diffusion layer containing Cu and Ni or Cu, which is formed by mutual diffusion of Cu in the bonding layer and Ni in the electrode or Cu in the bonding layer and the electrode, wherein an oxide layer is not substantially present at the boundary between the bonding layer and the electrode, and wherein an oxide layer of Cu or Ni is not substantially present between the electrode and the bonding layer.

13. A semiconductor device according to claim 12, wherein the heat conductivity of the bonding layer is from 50 to 430 W/mK.

14. A semiconductor device according to claim 12, wherein the bonding layer comprises a fired layer obtained by heating a bonding material containing particles of cupric oxide with and average size of from 1 nm to 50 μm and an organic reducing agent in a reducing atmosphere to prevent formation of the oxide layer between the electrode and the bonding layer.

15. A semiconductor device according to claim 12, wherein the bonding layer consists essentially of Cu.

16. A semiconductor device, which comprises:
a semiconductor element sandwiched between electrodes made of a material selected from the group consisting of Cu, Ni or their alloys, wherein both faces of the semiconductor element are bonded to the electrodes by means of bonding layers of fired copper between the electrodes and the element, and wherein a diffusion layer containing both Cu and Ni or Cu is formed between the bonding layers and the electrodes.

17. A semiconductor device according to claim 16, wherein the bonding layer consists essentially of Cu.

* * * * *